(12) United States Patent
Lee et al.

(10) Patent No.: US 11,119,420 B2
(45) Date of Patent: Sep. 14, 2021

(54) PARTICLE PREVENTION METHOD IN LITHOGRAPHY EXPOSURE APPARATUS

(71) Applicant: TAIWAN SEMICONDUCTOR MANUFACTURING CO., LTD., Hsinchu (TW)

(72) Inventors: Yi-Wei Lee, Taoyuan (TW); Jui-Chieh Chen, Hsinchu (TW); Chih-Tsung Shih, Hsinchu (TW); Tsung-Chuan Lee, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/885,149

(22) Filed: May 27, 2020

(65) Prior Publication Data

US 2021/0191283 A1 Jun. 24, 2021

Related U.S. Application Data

(60) Provisional application No. 62/949,782, filed on Dec. 18, 2019.

(51) Int. Cl.
*G03F 7/20* (2006.01)
*H01L 21/677* (2006.01)
*H01L 21/027* (2006.01)

(52) U.S. Cl.
CPC ...... *G03F 7/70741* (2013.01); *H01L 21/0274* (2013.01); *H01L 21/67721* (2013.01)

(58) Field of Classification Search
CPC .... G03F 7/70741; G03F 1/66; G03F 7/70916; G03F 7/70925; H01L 21/67356; H01L 21/67389; H01L 21/67393; H01L 21/67396
See application file for complete search history.

(56) References Cited

U.S. PATENT DOCUMENTS

2006/0073395 A1* 4/2006 Phillips ............... G03F 7/70741
430/5
2007/0211232 A1* 9/2007 Phillips .................... G03F 1/82
355/30

* cited by examiner

*Primary Examiner* — Steven Whitesell Gordon
(74) *Attorney, Agent, or Firm* — Maschoff Brennan

(57) ABSTRACT

In accordance with some embodiments, a method for processing a semiconductor wafer is provided. The method includes transporting a carrier along with a reticle supported by the carrier in a lithography exposure apparatus. The method also includes regulating particles in the carrier through a magnetic field. In addition, the method includes removing the reticle from the carrier. The method further includes performing, using the reticle, a lithography exposure process to the semiconductor wafer in the lithography exposure apparatus.

20 Claims, 15 Drawing Sheets

PARTICLE PREVENTION METHOD IN LITHOGRAPHY EXPOSURE APPARATUS

PRIORITY CLAIM AND CROSS-REFERENCE

This application claims the benefit of U.S. Provisional Application No. 62/949,782, filed on Dec. 18, 2019, the entirety of which is incorporated by reference herein.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs. Such scaling-down has also increased the complexity of processing and manufacturing ICs.

A lithography exposure process forms a patterned photoresist layer for various patterning processes, such as etching or ion implantation. In a lithography exposure process, a photosensitive layer (resist) is applied to a surface of a semiconductor substrate, and an image of features defining parts of the semiconductor device is provided on the layer by exposing the layer to a pattern of high-brightness light. As semiconductor processes evolve to provide for smaller critical dimensions, and devices become smaller and increase in complexity, including the number of layers, a way of accurately patterning the features is needed in order to improve the quality, reliability, and yield of the devices.

Although numerous improvements to the methods of performing a lithography exposure process have been invented, they have not been entirely satisfactory in all respects. Consequently, it would be desirable to provide a solution to improve the lithographic system so as to increase the production yield of the semiconductor wafers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
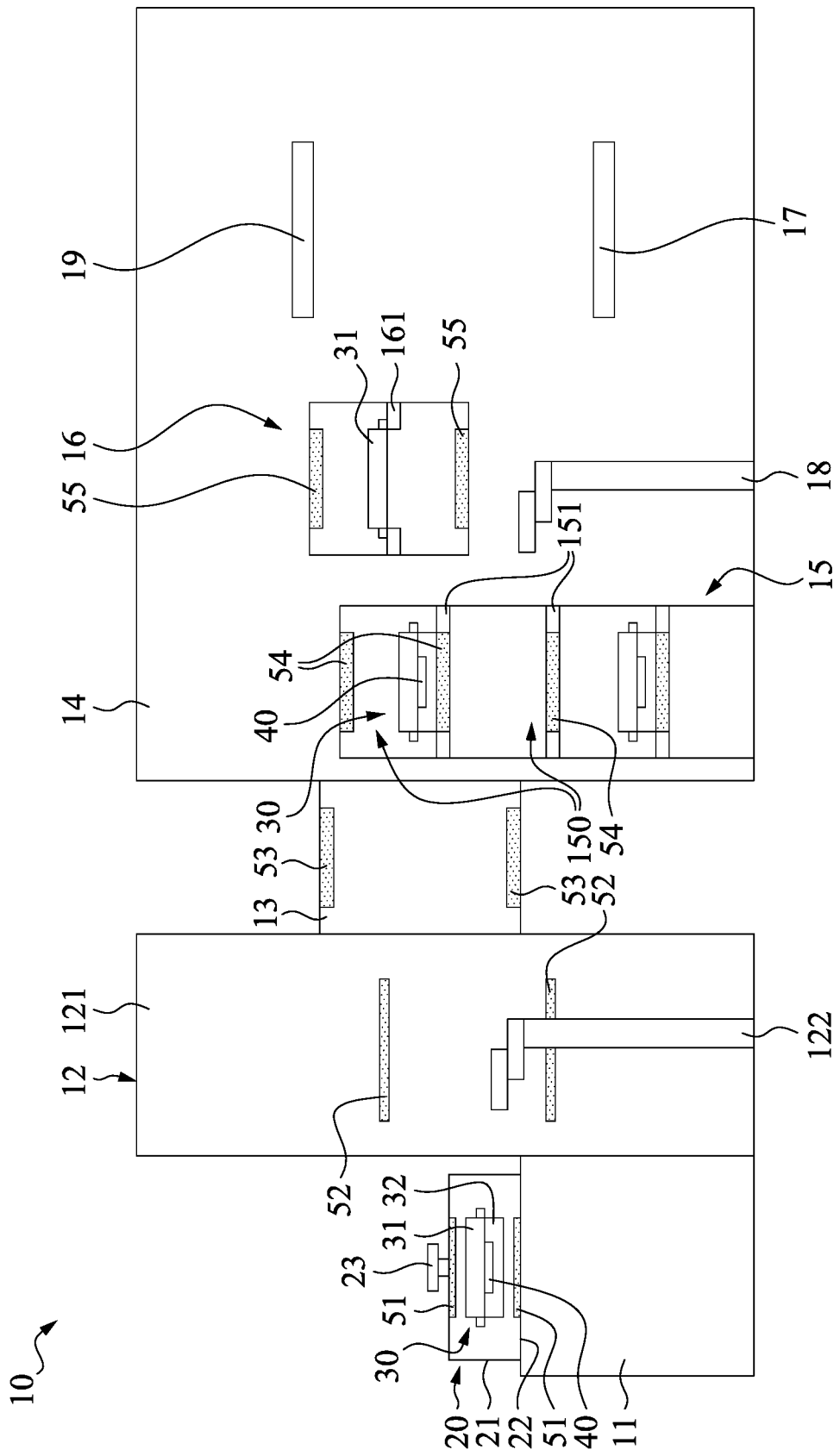
FIG. 1 shows a schematic diagram of a lithography exposure apparatus, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Particle falling on a mask will injury the pattern on a semiconductor wafer, which leads to an increase in cost and manufacturing time for rework. To address this issue, embodiments of the present disclosure provide a method for capturing particles on a reticle in lithography exposure apparatus by applying one or more magnetic fields. In some embodiments, the magnetic field is installed in a carrier. The magnetic field can be bilateral arranged and may be induced by electromagnet or permanent magnet. The orientation of magnetic field will be forward and the direction of magnetic field will be vertical or horizontal. In some embodiments, one or more grooves are formed in the carrier and adjacent to the magnetic field to trap the particles. With the mechanism for capturing particles, particle falling rate on the mask is reduced and the wafer yield is improved.

FIG. 1 shows a schematic diagram of a lithography exposure apparatus 10, in accordance with some embodiments. The lithography exposure apparatus 10 may also be generically referred to as a scanner that is operable to perform lithography exposing processes with respective radiation source and exposure mode using a reticle 40. In the present disclosure, the terms mask, reticle, and reticle are used interchangeably.

The lithography exposure apparatus 10 is configured to perform a lithography exposure process on a semiconductor wafer. The lithography exposure apparatus 10 may be any kind of lithography apparatuses such as immersion scanners, extreme ultraviolet (EUV) scanners, stepper and/or the like. It should be appreciated that the features described below can be replaced or eliminated in other embodiments of the lithography exposure apparatus 10.

The lithography exposure apparatus 10 includes the load port 11, an interface module 12, a load lock chamber 13, a vacuum vessel 14, a reticle library 15, an upper lid handling chamber 16, a reticle exchanging station 17, a transfer mechanism 18, and a reticle chuck 19, in accordance with some embodiments.

Figure 2A:
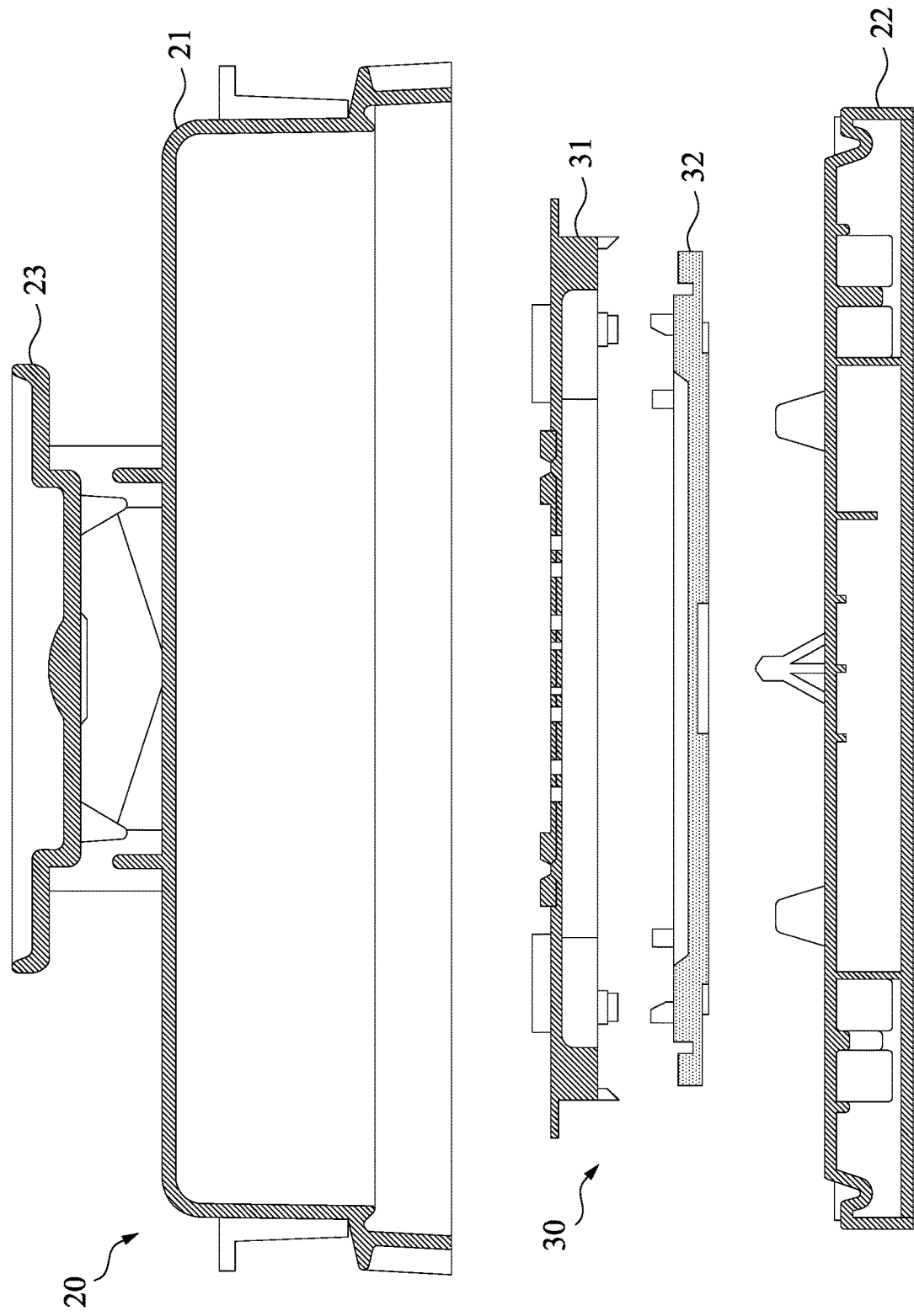
FIG. 2A shows an explosive view of a transport pod and a carrier, in accordance with some embodiments.

The load port 11 is configured to load a transport pod 20 for storing one or more reticles 40. As shown in FIG. 2A, the transport pod 20 includes a top cover 21 and a bottom door 22. The top cover 21 and the bottom door 22 collectively define a space that is free or substantially free of foreign particles. In some embodiments, the transport pod 20 also includes a grip element 23 affixed to the top cover 21 so that an overhead hoist transport (OHT) assembly (not shown in figures) can easily carry the transport pod 20. In some embodiments, as shown in FIG. 1, the transport pod 20 further includes two magnetic elements 51 for regulating particles in the transport pod 20. The two magnetic elements 51 are respectively positioned on the top cover 21 and the bottom door 22. The two magnetic elements 51 may be permanent magnets or electromagnets electrically connected to a power control unit (not shown in figures) of the transport pod 20.

The carrier 30 is configured so that the transport pod 20 can fit around the carrier 30. In some embodiments, the carrier 30 has an upper lid 31 and a baseplate 32. The upper lid 31 and the baseplate 32 collectively define a space for receiving a reticle 40. When the reticle 40 is transported to the load port 11, the carrier 30 is located in the transport pod 20, and the reticle 40 is located in the carrier 30. As a result, further protection for the reticle 40 is provided. The structural features of the carrier 30 will be described in more detail later with reference to FIG. 2B.

The interface module 12 is configured to handle the carrier 30 from the transport pod 20. The interface module 12 includes a housing 121, and one or more transferring means such as a robotic arm 122, in accordance with some embodiments. In some embodiments, the interface module 12 includes an equipment front end module (EFEM). The robotic arm 122 is disposed within the housing 121. The robotic arm 122 is configured for physically transporting the carrier 30. For example, the robotic arm 122 may retrieve the carrier 30 from the transport pod 20 to the housing 121, or the robotic arm 122 may transport the carrier 30 to and from the load lock chamber 13. However, the locations where the robotic arm 122 may transport the carrier 30 are not limited by the present embodiment.

The load lock chamber 13 is located between the interface module 12 and the vacuum vessel 14. The load lock chamber 13 is configured for preserving the atmosphere within the vacuum vessel 14 by separating it from the interface module 12. The load lock chamber 13 is capable of creating an atmosphere compatible with the vacuum vessel 14 or the interface module 12, depending on where the loaded carrier 30 is scheduled to be next. This can be performed by altering the gas content of the load lock chamber 13 by such means as adding gas or creating a vacuum, along with other suitable means for adjusting the atmosphere in the load lock chamber 13.

The vacuum vessel 14 preserves a vacuum environment at an ultra-high vacuum pressure. The reticle library 15, the upper lid handling chamber 16, the reticle exchanging station 17 and the reticle chuck 19 are positioned in the vacuum vessel 14. The reticle library 15 is configured to store one or more than one carriers 30 in the vacuum vessel 14. In some embodiments, the reticle library 15 includes a number of storing spaces 150. The storing spaces 150 are separated by a number of racks 151 vertically arranged along a height direction of the reticle library 15.

The upper lid handling chamber 16 is configured for storing one or more upper lids 31 removed from the carrier 30. In some embodiments, the upper lid handling chamber 16 includes a number of holding members 161 for supporting the upper lids 31 removed from the carrier 30. The reticle chuck 19 is configured for securing the reticle 40 during the lithography exposure process. In some embodiments, the reticle chuck 19 includes an E-chuck which creates a clamping force by generating an electrostatic field.

The reticle exchanging station 17 is configured to support the baseplate 32 of the carrier 30 before the reticle 40 is secured by the reticle chuck 19 or after the baseplate 32 is released from the reticle chuck 19. In some embodiments, the reticle exchanging station 17 is positioned relative to the reticle chuck 19. In some other embodiments, the reticle exchanging station 17 is able to be moved by a driving member, such as linear motor (not shown in figures). To place the reticle 40 on a preset position of the reticle chuck 19, an alignment tool (such as a camera, not shown in figures) produces information about the position of the reticle exchanging station 17 and/or the reticle chuck 19, and the reticle exchanging station 17 is moved by using the information from the alignment tool to perform an alignment process on the reticle exchanging station 17 relative to the reticle chuck 19.

The transfer mechanism 18 is configured to transfer the carrier 30 or the baseplate 32 of the carrier 30 within the vacuum vessel 14. The transfer mechanism 18 may be elevated, moved leftward and rightward, moved forward and backward, and rotated around the vertical axis so as to transfer the carrier 30 or the baseplate 32 of the carrier 30 among the load lock chamber 13, the reticle library 15, the upper lid handling chamber 16, and the reticle exchanging station 17. However, the locations where the transfer mechanism 18 may transport the carrier 30 or the baseplate 32 of the carrier 30 are not limited by the present embodiment.

In some embodiments, a number of magnetic elements, such as magnetic elements 52, magnetic elements 53, magnetic elements 54 and magnetic element 55 are located at different positions in the lithography exposure apparatus 10. The magnetic elements 52 are located in the housing 121 and configured to regulate particles in the carrier 30 when the carrier 30 is moved in the housing 121. The number of the magnetic elements 52 may be two (2) and respectively arranged at an upper side and a lower side of a moving path along which the carrier 30 is transported in the housing 121.

The magnetic elements 53 are located in the load lock chamber 13 and configured to regulate particles in the carrier 30 when the carrier 30 is placed in the load lock chamber 13. The number of the magnetic elements 53 may be two (2) and respectively arranged at an upper side and a lower side of a support (not shown in figures) on which the carrier 30 is placed in the load lock chamber 13.

The magnetic elements 54 are located in the reticle library 15 and configured to regulate particles in the carrier 30 when the carrier 30 is placed in reticle library 15. Each of the racks 151 of the reticle library 15 has a magnetic element 54 mounted thereon and a top roof of the reticle library 15 also has a magnetic element 54 mounted thereon. As such, two magnetic elements 54 are arranged at an upper side and a lower side of the storing spaces 150 in which the carrier 30 is placed in the reticle library 15.

The magnetic elements 55 are located in the upper lid handling chamber 16 and configured to regulate particles in the carrier 30 when the carrier 30 is placed in the upper lid handling chamber 16. The number of the magnetic elements 55 may be two (2) and respectively arranged at an upper side and a lower side of the holding members 161 which is used to support an upper lid 31 of the carrier 30.

Figure 2B:
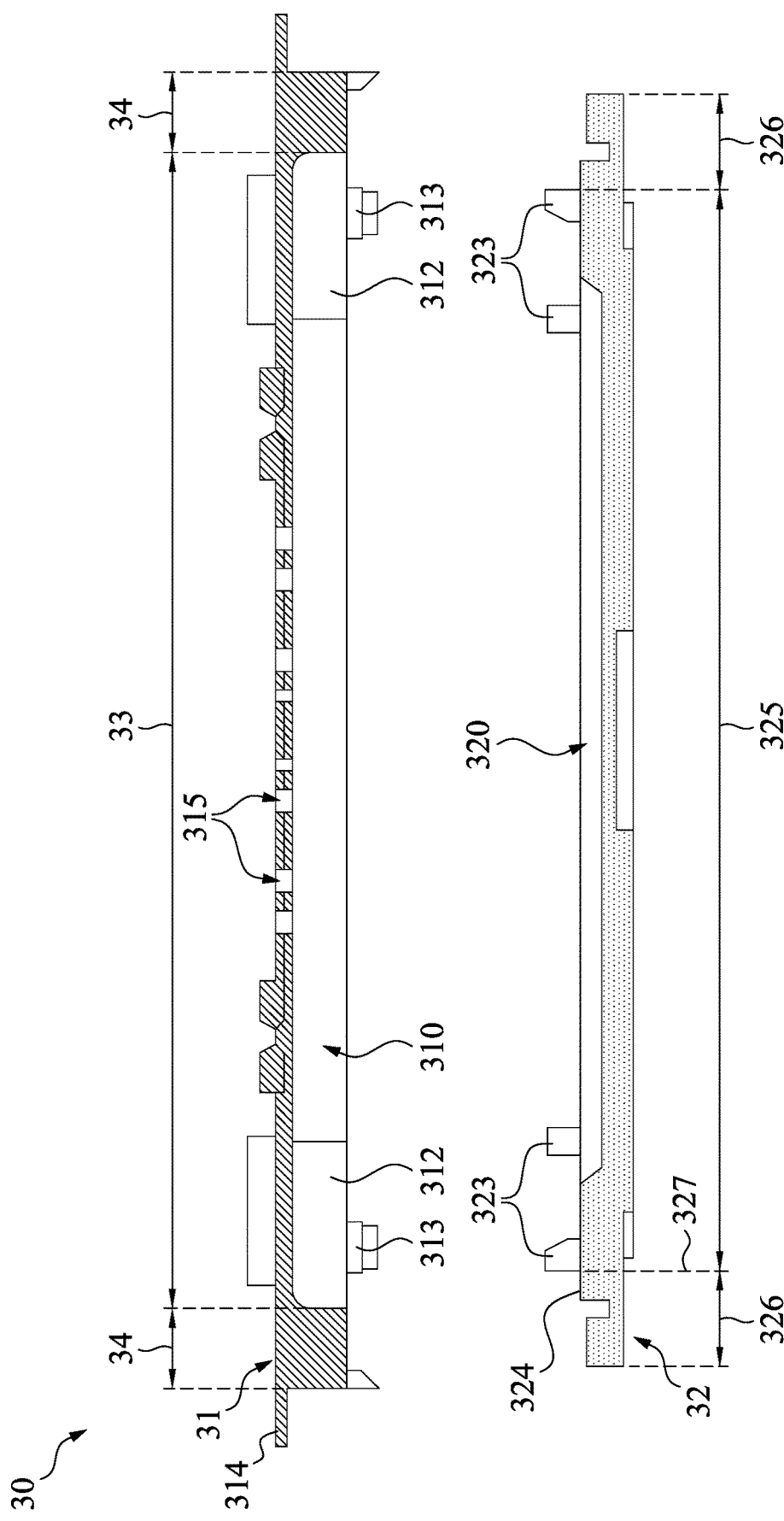
FIG. 2B shows an explosive view of a carrier, in accordance with some embodiments.
Figure 3:
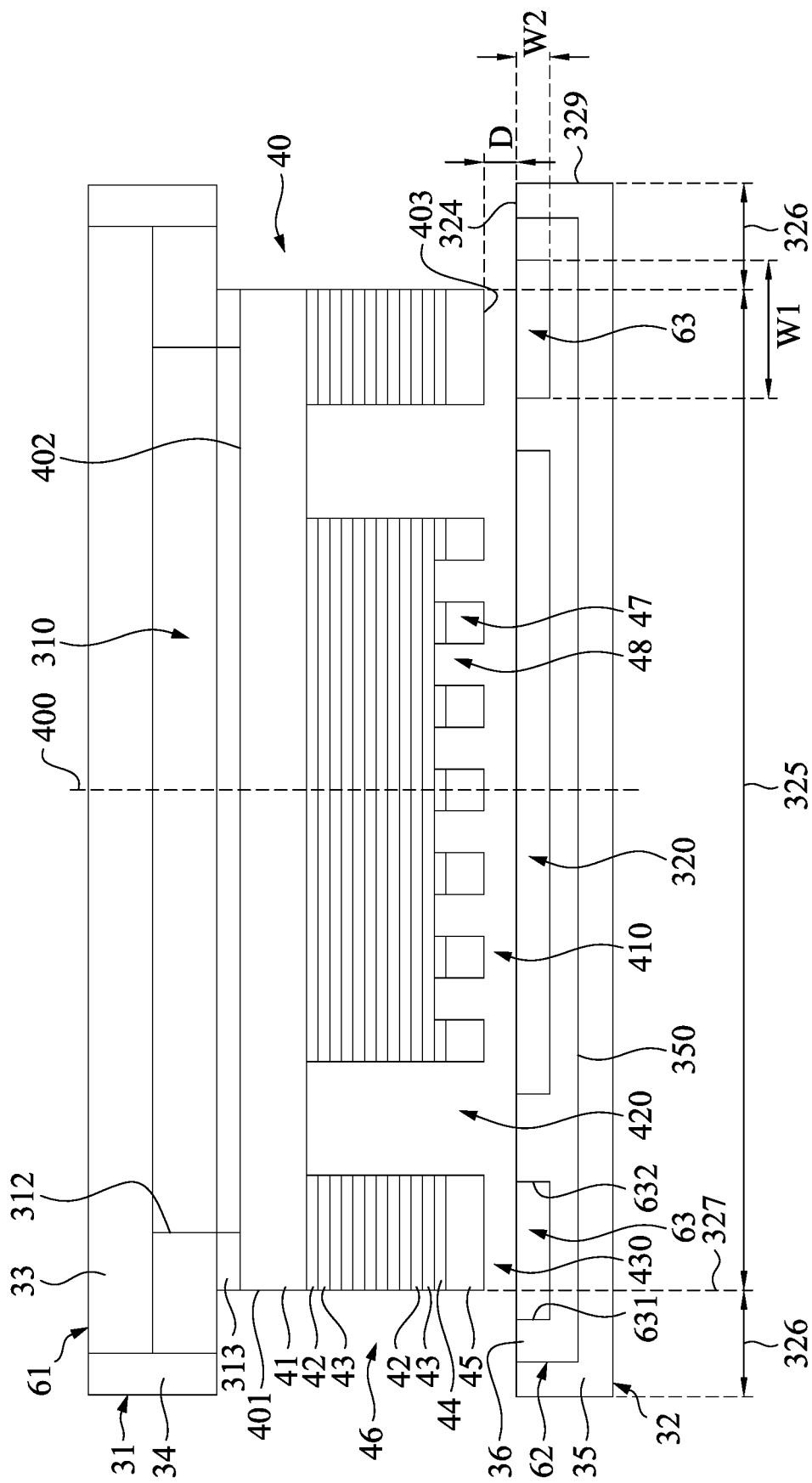
FIG. 3 shows a schematic view of a carrier as a reticle positioned therein, in accordance with some embodiments.

FIG. 2B shows an explosive view of the carrier 30, in accordance with some embodiments. FIG. 3 shows a schematic view of the carrier 30 as the reticle 40 positioned therein, in accordance with some embodiments. The detailed features of the carrier 30 in FIG. 3 are simplified to clearly illustrate the relative relationship between magnetic elements 61 and 62 and the reticle 40. In some embodiments, the upper lid 31 includes a first portion 33 and a second portion 34. The first portion 33 is formed with a rectangular shape, and a number of gas holes 315 penetrating the first portion 33. The second portion 34 surrounds the first portion 33. In one embodiment, the second portion 34 has a greater thickness than that of the first portion 33, and a recess 310 is defined by the first portion 33 and the second portion 34, as shown in FIG. 2B.

In some embodiments, the upper lid 31 further includes a number of supports 312 (such as four supports and only two supports are shown in FIGS. 2B and 3) and a number of pins 313 (such as four pins and only two supports are shown in FIGS. 2B and 3). The supports 312 are positioned at four corners of the first portion 33 and located in the recess 310. The pins 313 are respectively connected to the supports 312 and extending toward the baseplate 32. The pins 313 are configured to abut against a bottom surface 402 (i.e., a surface without patterns) of the reticle 40 to prevent a movement of the reticle 40 in a vertical direction during the transportation. In some embodiments, the upper lid 31 further includes a number of flanges 314e horizontally protruded from the second portion 334 for facilitating a movement of the upper lid 31 relative to the baseplate 32.

In some embodiments, the upper lid 31 of the carrier 30 includes a magnet for regulating particles in the carrier 30. In one exemplary embodiment, the first portion 33 of the upper lid 31 and the supports 312 are permanent magnet or electromagnet, and the second portion 34 of the upper lid 31 is made of nickel coated non-magnetized aluminum alloy in some embodiments of the present disclosure. The nickel coating is Ni—P or Ni—Cr in some embodiments of the present disclosure. The first portion 33 of the upper lid 31 and the supports 312 may be fabricated integrally, and connected to the second portion 34 of the upper lid 31 through suitable techniques, such as gluing. The pins 313 may be formed of pliable material such as rubber to prevent a scratch of the bottom surface 402 of the reticle 40 being occurred. The pins 313 may be connected to the supports 312 through suitable techniques, such as threading. For the purpose of illustration, the first portion 33 of the upper lid 31 and the supports 312 are collectively referred to as a magnetic element 61 in the following descriptions.

In some embodiments, as shown in FIG. 2B, the baseplate 32 has an inner surface 324 facing the upper lid 31. The inner surface 324 of the baseplate 32 has an inner region 325 and an outer region 326. The inner region 325 has a rectangular shape and located relative to a center of the baseplate 32. The outer region 326 surrounds the inner region 325 and connects the inner region 325 to an edge 329 of the baseplate 32.

Figure 4:
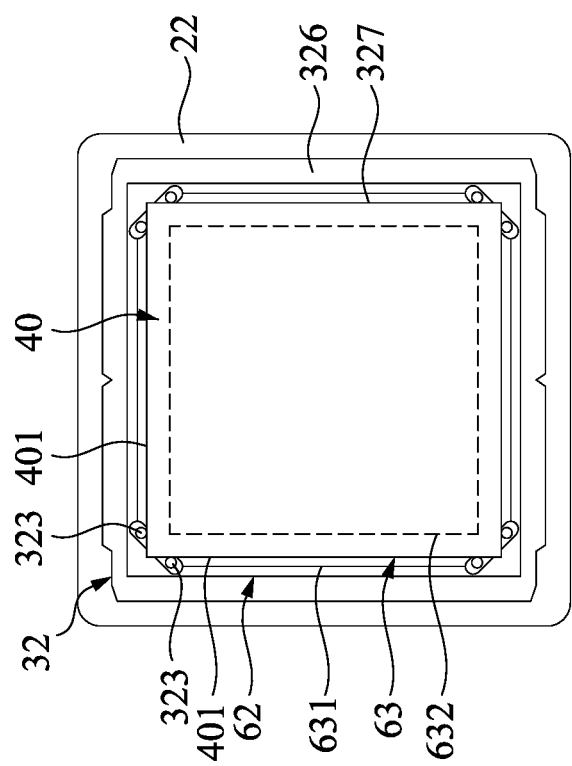
FIG. 4 shows a top view of a baseplate as a reticle positioned therein, in accordance with some embodiments.

In some embodiments, a number of stubs 323 for positioning the reticle 40 are formed on the inner surface 324. In some embodiments, as show in FIG. 4, the baseplate 32 includes four (4) pairs of stubs 323 respectively located adjacent to four corners of the baseplate 32. Each pair of the stubs 323 is arranged such that when the reticle 40 is supported by the baseplate 32, a corner of the reticle 40 is positioned between the two stubs 323, and two intersected edges 401 of the reticle 40 are respectively abutted by one of the stubs 323 of each pair. That, each edge 401 of the reticle 40 is abutted by two stubs 323 from two different pairs of the stubs 323.

In some embodiments, as show in FIG. 2B, the stubs 323 used for abutting against the edges 401 of the reticle 40 are arranged along a boundary 327 of the inner region 325 and the outer region 326. As a result, as shown in FIG. 3, when the reticle 40 is supported by the baseplate 32, the boundary 327 of the inner region 325 and the outer region 326 overlaps the edge of the reticle 40. In other words, the inner region 325 is defined by a vertical projection of the reticle 40 when the reticle 40 is supported by the baseplate 32.

In some embodiments, as shown in FIG. 3, the baseplate 32 includes a first portion 35 and a second portion 36. The first portion 35 defines a recess 350 arranged relative to a center of the baseplate 32. The recess 350 has a greater width than that of the inner region 325 of the inner surface 324. The second portion 36 is positioned in the recess 350 of the first portion 35. The second portion 36 has a shape conformal to the shape of the recess 350, and thus the second portion 36 also has a greater width than that of the inner region 325 of the inner surface 324.

In some embodiments, the second portion 36 has another recess 320 arranged relative to the center of the baseplate 32. In addition, the second portion 36 has a groove 63 entirely surrounding the recess 320. As shown in FIG. 3, the groove 63 has an inner wall 632 and an outer wall 631. The inner wall 632 is located closer to the recess 320 than the outer wall 631. Both the inner wall 632 and the outer wall 631 are parallel to the edge 329 of the baseplate 32. In some embodiments, the boundary 327 of the inner region 325 and the outer region 326 is located between the inner wall 632 and the outer wall 631. That is, when the reticle 40 is postponed on the baseplate 32, a vertical projection of the edge 401 of the reticle 40 is located within the groove 63. In some embodiments, the groove 63 has a width W1 in a range from about 5 mm to about 15 mm and has a depth W2 less than 5 mm. However, the design of the dimensions of the groove 63 is not limited to this embodiments and would be selected as long as the particles are able to be trapped in the grooves 63 and no contaminations of the patterned area of the reticles occurs.

In some embodiments, the baseplate 32 of the carrier 30 includes a magnet for regulating particles in the carrier 30. In one exemplary embodiment, the second portion 36 of the baseplate 32 is permanent magnet or electromagnet, and the first portion 35 of the baseplate 32 is made of nickel coated non-magnetized aluminum alloy in some embodiments of the present disclosure. The nickel coating is Ni—P or Ni—Cr in some embodiments of the present disclosure.

The second portion 36 may be connected to the first portion 35 of the baseplate 32 through suitable techniques, such as gluing. After assembly, an upper surface of the first portion 35 and an upper surface of the second portion 36 collectively construe the inner surface 324 of the baseplate 32. Therefore, the entire inner region 325 of the inner surface 324 is magnetic. In addition, an area of the outer region 326 that is adjacent to the inner region 325 is magnetic, and the remaining area of the outer region 326 that is adjacent to the edge 329 of the baseplate 32 is non-magnetic. For the purpose of illustration, the second portion 36 of the baseplate 32 is referred to as magnetic element 62 in the following descriptions.

It will be appreciated that while in the present embodiment at least a portion of the upper lid 31 or at least a portion of the baseplate 32 of the carrier 30 is made of magnetic element, many variations and modifications can be made to embodiments of the disclosure. In some other embodiments, both the upper lid 31 and the baseplate 32 are made of non-magnetic material, and one or more than one sheets of magnetic material is conformally covering the inner surfaces of the upper lid 31 and/or the baseplate 32 facing each other. In some embodiments, the magnetic element can be positioned at any suitable position in the carrier 30, and a vertical projection overlaps the inner region 325 of the baseplate 32. In the embodiment shown in FIG. 3, projections of both magnetic elements 61 and 62 overlap the inner region 325 of the baseplate 32 and a portion of outer region 326 of the baseplate 32.

In addition, although FIG. 3 illustrates two magnetic elements (e.g., magnetic element 61 and magnetic element 62) to generate magnetic field for regulating particles, the carrier 30 can include any number of magnetic elements to generate any number of magnetic fields. For example, the upper lid 31 is made of non-magnetic material and there is no magnetic element attached on the upper lid 31. Particles in the carrier 30 are regulated by the magnetic element disposed on the baseplate 32. In cases where the magnetic element is attached on the upper lid 31 and/or the baseplate 32, the magnetic element may have an eddy shape as seen from a top view.

In accordance with some embodiments, as shown in FIG. 3, the reticle 40 includes a pattern region 410 and a border region 430. The pattern region 410 is located relative to a center 400 of the reticle 40. The border region 430 may surround the pattern region 410 and be separated from the pattern region 410 by a trench 420. The trench 420 may partially or entirely surround the pattern region 410.

In some embodiments, the reticle 40 is an extreme ultraviolet (EUV) reticle. The EUV lithography exposure process utilizes a reflective reticle rather than a transmissive reticle. The EUV lithography exposure process utilizes EUV scanners that emit light in the extreme ultraviolet (EUV) region, which is light having an extreme ultraviolet wavelength, such as 10-15 nm. In some embodiments, the EUV source generates EUV with wavelength at about 13.6 nm. Some EUV scanners may use reflective optics, i.e. mirrors and work in the vacuum environment. EUV scanners may provide the desired pattern on an absorption layer (e.g., an "EUV" reticle absorber) formed on a reflective reticle. Within the EUV range, all materials are highly absorbing. Thus, reflective optics rather than refractive optics are used.

In some embodiments, the reticle 40 includes a mask substrate 41, a reflective multilayer (ML) structure 46, a capping layer 44, and an absorption layer 45. In addition, the mask substrate 41, the reflective ML structure 46, and the absorption layer 45 may be positioned in the pattern region 410, the border region 430 of the reticle 40 according to certain embodiments of the present disclosure.

The mask substrate 41 may be made of a suitable material, such as a low thermal expansion material (LTEM) or fused quartz. In some embodiments, the LTEM includes $TiO_2$ doped $SiO_2$, or other suitable materials with low thermal expansion. The reflective ML structure 46 may be positioned over the mask substrate 41. In some embodiments, the reflective ML structure 46 includes a plurality of film pairs, such as molybdenum-silicon (Mo/Si) film pairs (e.g. a layer of molybdenum 42 above or below a layer of silicon 43 in each film pair). In some other embodiments, the reflective ML structure 46 may include molybdenum-beryllium (Mo/Be) film pairs, or other suitable materials that are configurable to highly reflect the EUV light.

The characteristics of the reflective ML structure 46 are selected such that it provides a high reflectivity to a selected electromagnetic radiation type/wavelength. For example, for the purpose of EUV lithography, the reflective ML structure 46 may be designed to reflect light within the EUV range. The thickness of each layer of the reflective ML structure 46 depends on the EUV wavelength and the incident angle. Particularly, the thickness of the reflective ML structure 46 (and the thicknesses of the film pairs) may be adjusted to achieve a maximum constructive interference of the EUV light diffracted at each interface and a minimum absorption of the EUV light. In some embodiments, the number of the film pairs in the reflective ML structure 46 may be in a range from about 20 to about 80. However, any number of film pairs may be used. For example, the reflective ML structure 46 may include forty pairs of layers of Mo/Si. For example, each Mo/Si film pair has a thickness of about 7 nm and the reflective ML structure 46 has a total thickness of 280 nm.

In some embodiments, the capping layer 44 is positioned over the reflective ML structure 46. The capping layer 44 is designed to be transparent to EUV light and to protect the reflective ML structure 46 from damage and/or oxidation. In addition, the capping layer 44 may serve as an etching stop layer in a patterning or repairing/cleaning process of the absorption layer 45 over the capping layer 44. The capping layer 44 may have different etching characteristics from the absorption layer. In some embodiments, the capping layer 44 is formed of ruthenium (Ru), Ru compounds such as RuB and RuSi, chromium (Cr), Cr oxide, and Cr nitride. A low temperature deposition process may be often chosen for forming the capping layer 44 so as to prevent inter-diffusion of the reflective ML structure 46. The thickness of the capping layer 44 may be in a range from about 2 nm to about 7 nm in certain embodiments.

The absorption layer 45 may be positioned over the capping layer 44. The absorption layer 45 is used to form the desired exposure pattern (e.g., the absorption layer 45 in the pattern region 410) onto the front-side surface 403 of the reticle 40. In some embodiments, the absorption layer 45 is an absorption material to absorb radiation in the EUV wavelength range projected onto the pattern region 410 of the reticle 40. In some examples, the absorption layer 45 may include multiple film layers with each film containing chromium, chromium oxide, chromium nitride, titanium, titanium oxide, titanium nitride, tantalum, tantalum oxide, tantalum nitride, tantalum oxynitride, tantalum boron nitride, tantalum boron oxide, tantalum boron oxynitride, aluminum, aluminum-copper, aluminum oxide, silver, silver oxide, palladium, ruthenium, molybdenum, other suitable materials, and/or mixture of some of the above.

In some embodiments, the absorption layer 45 in the pattern region 410 may be patterned according to an IC layout pattern (or simply IC pattern). For example, the absorption layer 45 may be patterned to form opaque regions 47 and reflective regions 48. In the opaque region 47, the absorption layer 45 may be remained. An incident light is almost fully absorbed by the absorber. In the reflective regions 48, the absorption layer 45 may be removed and the incident light is reflected by the underlying reflective ML structure 46.

In some embodiments, as shown in FIG. 3, when the reticle 40 is positioned above the baseplate 32, the pattern region 410 faces the recess 320. With the arrangement of the recess 320, the absorption layer 45 is protected from being scratched by the baseplate 32 while the transportation of the reticle 40. In some embodiments, the reticle 40 is held by the stubs 323 (see FIG. 2B) so that the front-side surface 403 of the reticle 40 is not in direct contact with the inner surface 324 of the baseplate 32, and a gap is formed between the reticle 40 and the baseplate 32. A distance D between the border region 430 and the baseplate 32 may be in a range from about 200 microns to about 300 microns. The gap between the reticle 40 and the baseplate 32 may allow an air flow with contamination particles passing therethrough.

In some embodiments, in a horizontal direction, the groove 63 of the magnetic element 62 is located farther away from the center 400 of the reticle 40 than the trench 420 that separates the border region 430 from the pattern region 410. For example, as shown in FIG. 3, the inner wall 632 of the groove 63 is located below the border region 430 and is distant from the trench 420. In some embodiments, at least a portion of the groove 63 is not covered by the reticle 40 when the reticle 40 is supported by the baseplate 32. For example, as shown in FIG. 3, when the reticle 40 is positioned above the baseplate 32, the outer wall 631 is distant from the edge 401 of the reticle 40, and a portion of the groove 63 that is adjacent to the outer wall 631 is exposed by the reticle 40.

Figure 5A:
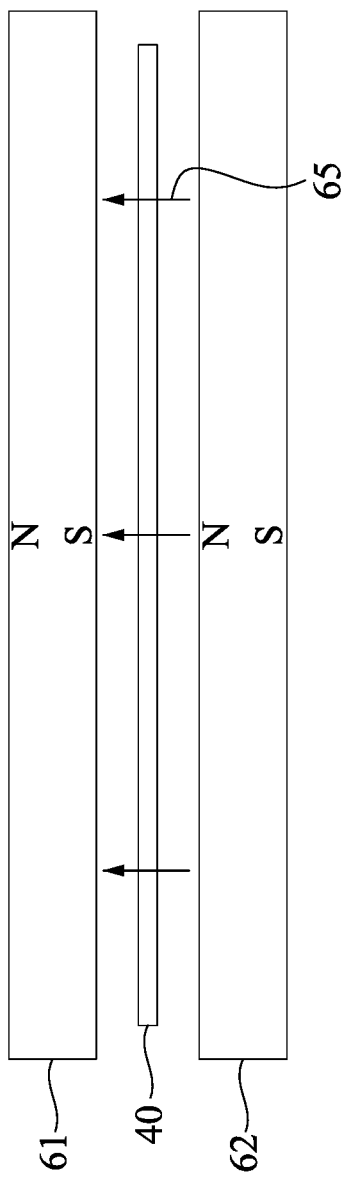
FIG. 5A schematically illustrates positions of magnet poles of magnetic elements relative to a reticle, in accordance with some embodiments.

In some embodiments, the magnetic element 61 and the magnetic element 62 are permanent magnets and the direction of the magnet field is vertical. For example, as shown in FIG. 5A, the magnetic element 61 and the magnetic element 62 are laterally positioned at two sides of the reticle 40. The magnetic element 61 is formed such that its north magnetic poles and south magnetic poles are arranged in a direction perpendicular to the reticle 40 with the south magnetic pole facing the reticle 40. The magnetic element 62 is formed such that its north magnetic poles and south magnetic poles are arranged in a direction perpendicular to the reticle 40 with the north magnetic pole facing the reticle 40. In such embodiment, the magnetic field 65 produced by the magnetic element 61 and the magnetic element 62 is perpendicular to the reticle 40.

Figure 5B:
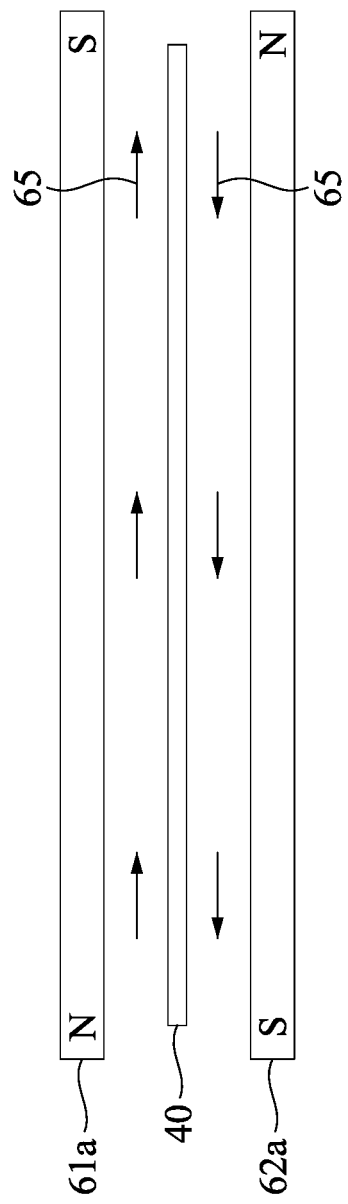
FIG. 5B schematically illustrates positions of magnet poles of magnetic elements relative to a reticle, in accordance with some embodiments.

In some embodiments, the magnetic element 61 and the magnetic element 62 are permanent magnets and the direction of the magnet field is horizontal. For example, as shown in FIG. 5B, the magnetic element 61 and the magnetic element 62 are laterally positioned at two sides of the reticle 40. The magnetic element 61 is formed such that its north magnetic poles and south magnetic poles are arranged in a direction parallel to the reticle 40 with the south magnetic pole and the north magnetic pole located adjacent to edge of the reticle 40. The magnetic element 62 is formed such that its north magnetic poles and south magnetic poles are arranged in a direction parallel to the reticle 40. The south magnetic pole of the magnetic element 62 faces the north magnetic pole of the magnetic element 61, and the north magnetic pole of the magnetic element 62 faces the south magnetic pole of magnetic element 61. In such embodiment, the magnetic field 65 produced by the magnetic element 61 and the magnetic element 62 is parallel to the reticle 40.

In some embodiments, the magnetic element 61 and the magnetic element 62 are electromagnets and can be magnetized to have a magnet field that is perpendicular to the reticle 40, as shown in FIG. 5A. Alternatively, the magnetic element 61 and the magnetic element 62 can be magnetized to have a magnet field that is parallel to the reticle 40, as shown in FIG. 5B. The electromagnets may be electrically connected a power control unit (not shown in figures) mounted on the carrier 30.

It will be noted that the configuration of the magnetic element is not limited to the above embodiments and may vary depending on intended use or design parameters. Some exemplary embodiments are provided below.

Figure 6:
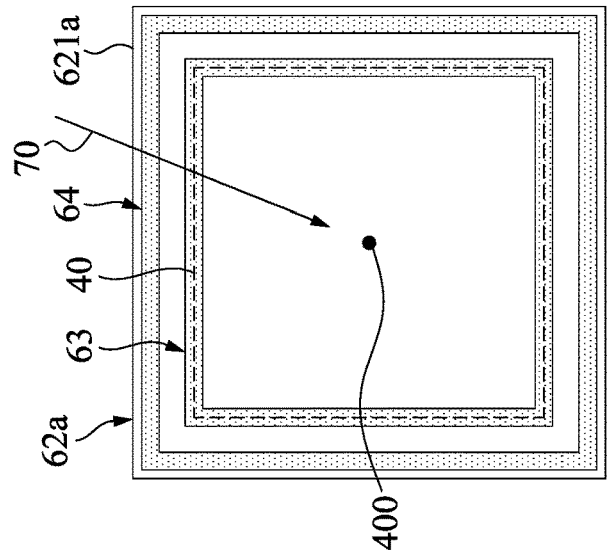
FIG. 6 shows a top view of a baseplate as a reticle positioned therein, in accordance with some embodiments.

FIG. 6 shows a top view of a magnetic element 62a, in accordance with some embodiments. Differences between the magnetic element 62a and the magnetic element 62 include the magnetic element 62a further including a groove 64. The groove 64 has a closed-loop shape (or ring shape) and entirely surrounds the groove 63. The groove 64 may extends parallel to the groove 63. In such embodiment, an air flow 70 around the reticle 40 will sequentially pass through the groove 64 and the groove 63 before its reaching to the center 400 of the reticle 40.

Figure 7:
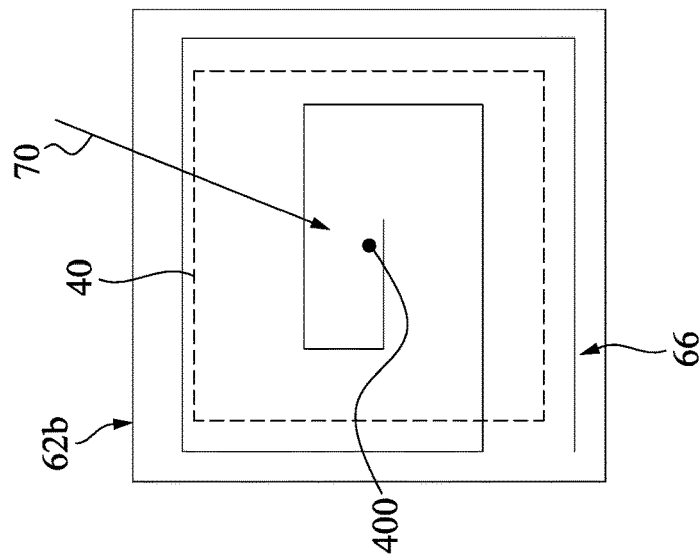
FIG. 7 shows a top view of a baseplate as a reticle positioned therein, in accordance with some embodiments.

FIG. 7 shows a top view of a magnetic element 62b, in accordance with some embodiments. Differences between the magnetic element 62b and the magnetic element 62 include the groove 63 being replaced with a groove 66. The groove 66 may have a spiral shape (or eddy shape) as seen from a top view. In such embodiment, an air flow 70 around the reticle 40 will sequentially pass through at least two sections of the groove 66 before its reaching to the center 400 of the reticle 40.

Figure 8:
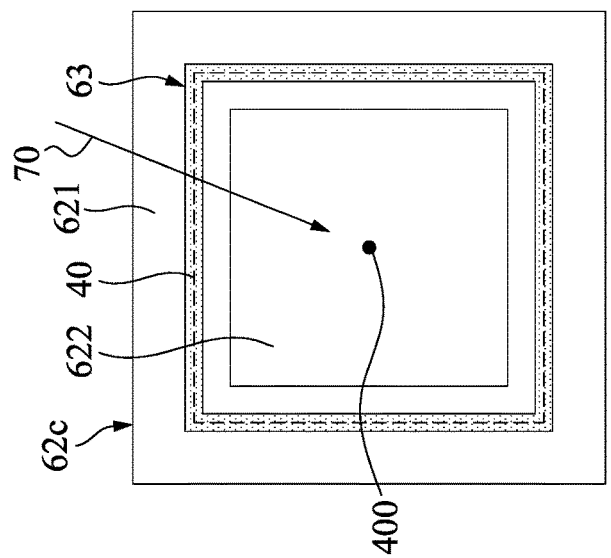
FIG. 8 shows a top view of a baseplate as a reticle positioned therein, in accordance with some embodiments.

FIG. 8 shows a top view of a magnetic element 62c, in accordance with some embodiments. Differences between the magnetic element 62c and the magnetic element 62 include the magnetic element 62c including two or more magnetic elements with different magnetic fluxes. For example, the magnetic element 62c includes a first magnetic element 621 and a second magnetic element 622. The first magnetic element 621 has a ring shape with the groove 63 formed thereon. The second magnetic element 622 has a rectangular shape and is surrounded by the first magnetic element 621. The second magnetic element 622 has an area less than the reticle 40. The second magnetic element 622 is completely covered by the reticle 40 when the reticle 40 is supported by the baseplate 32 (see FIG. 3). An intensity of the magnetic field of the first magnetic element 61 is greater than an intensity of the magnetic field of the second magnetic element 62.

In such embodiment shown in FIG. 8, an air flow 70 around the reticle 40 will sequentially pass through first magnetic element 621 and the second magnetic element 622 before its reaching to the center 400 of the reticle 40. In some embodiments, the second magnetic element 622 is omitted, the magnetic element 62*c* is consisted with a ring shape magnetic element with a void formed relative to a center of the reticle 40.

Figure 9:
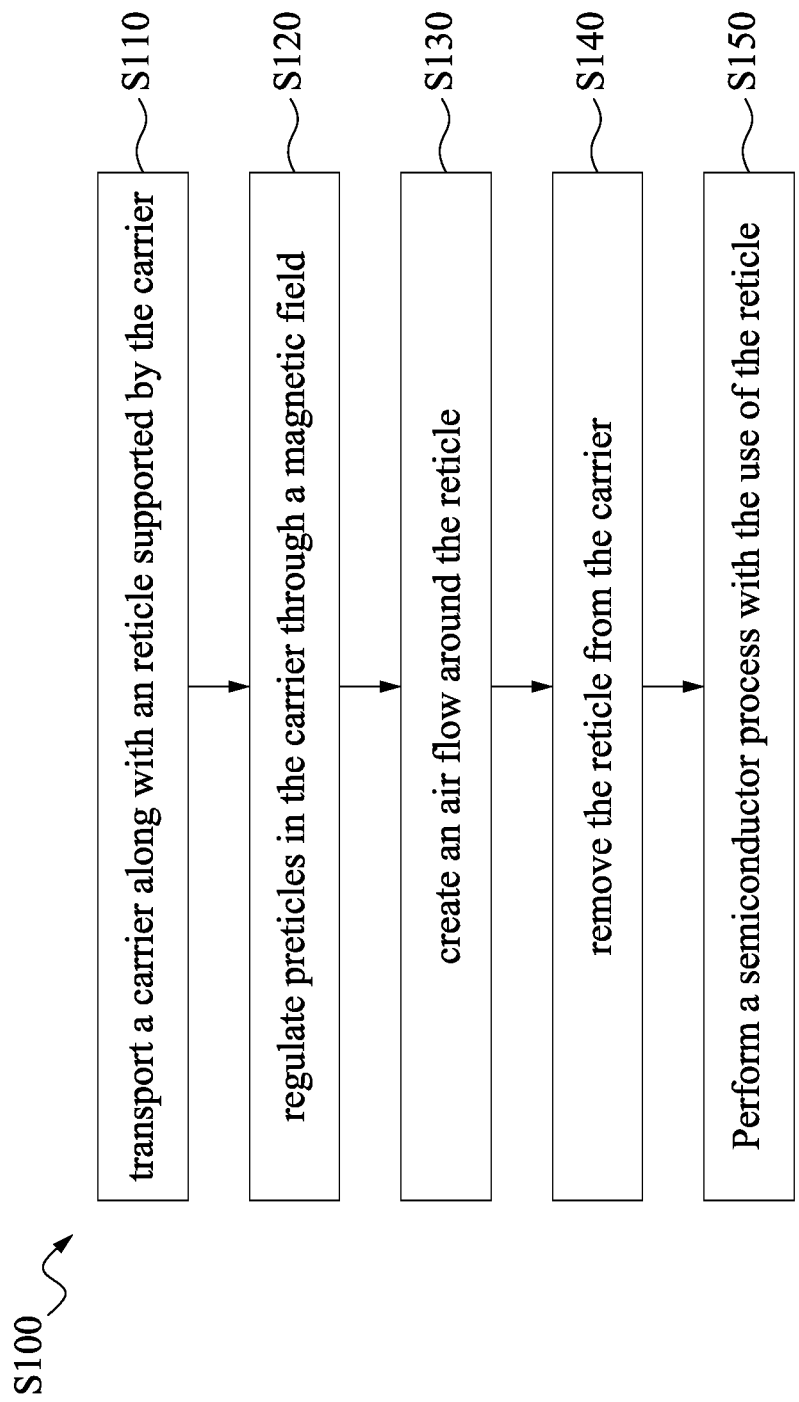
FIG. 9 shows a flow chart illustrating a method for transporting a reticle for semiconductor fabrication, in accordance with some embodiments.

FIG. 9 is a flow chart illustrating a method S100 for transporting a reticle, such as reticle 40, for semiconductor fabrication, in accordance with some embodiments. For illustration, the flow chart will be described along with the drawings shown in FIGS. 1 and 8-16. Additional operations can be provided before, during, and after the method S100, and some of operations described can be replaced or eliminated for other embodiments of the method.

The method S100 begins with operation S110, in which a carrier 30 along with a reticle 40 supported by the carrier 30 is transported. In some embodiments, the carrier 30 which contains a reticle 40 is moved in the lithography exposure apparatus 10 from the transport pod 20 to the reticle exchanging station 17. In some embodiments, to perform a lithography exposure process with the use of the reticle 40, the transport pod 20 which contains the reticle 40 in the carrier 30 is placed on the load port 11 of the lithography exposure apparatus 10, as shown in FIG. 1. After the transport pod 20 is placed on the load port 11, the carrier 30 is removed from the outer pod 20 by the robotic arm 122 and moved toward the load lock chamber 13, in the direction indicated by the arrow in FIG. 10.

Figure 11:
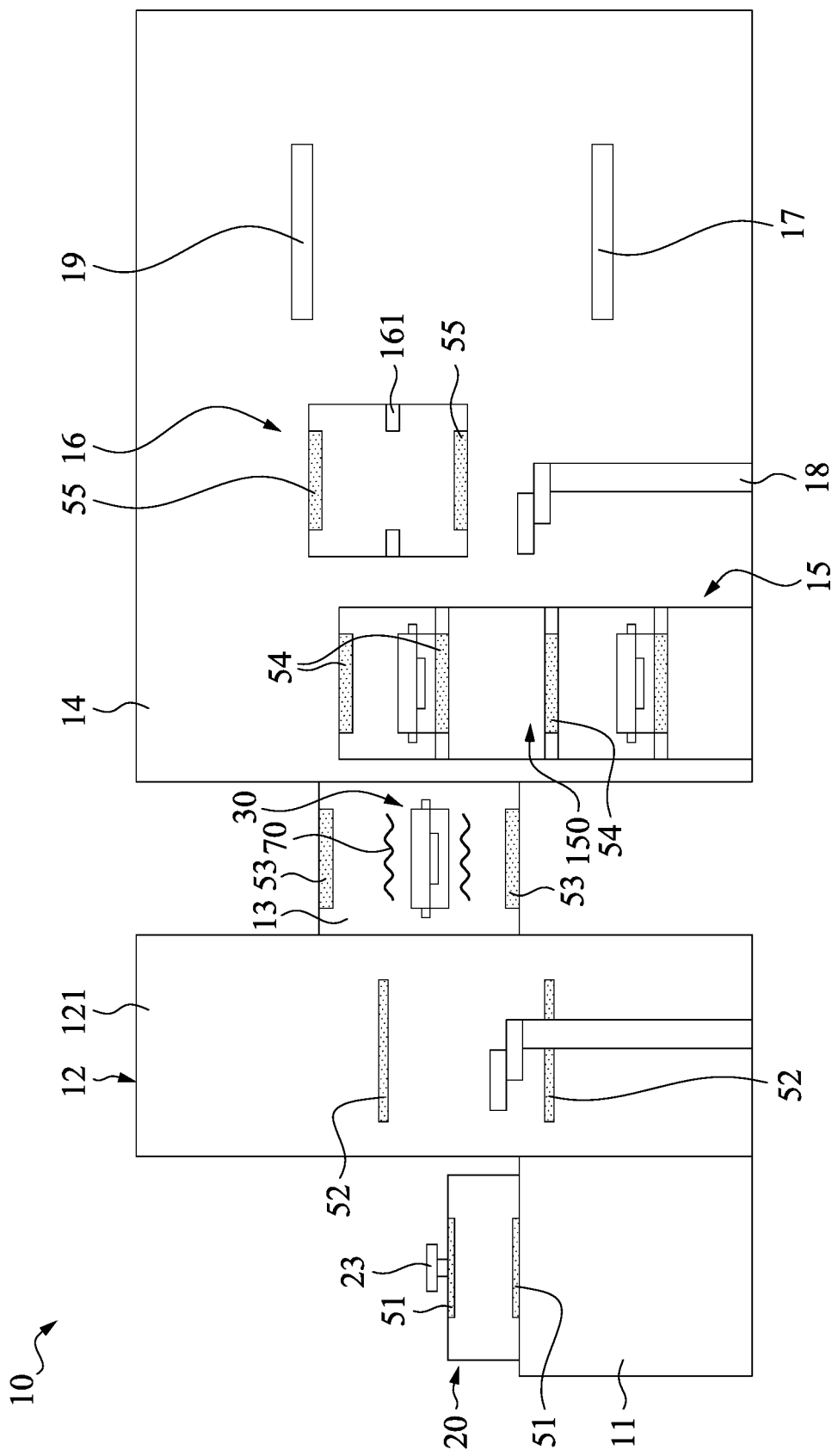
FIG. 11 shows a schematic view of a stage of a method for transporting a reticle for semiconductor fabrication in which a carrier along with a reticle is located in a load lock chamber, in accordance with some embodiments.

When the carrier 30 is placed in the load lock chamber 13, the robotic arm 122 returns to the housing 3121, as shown in FIG. 11. At this time, the load lock chamber 13 is sealed and an atmosphere compatible with the vacuum pressure in the vacuum vessel 14 is created by altering the gas content of the load lock chamber 13 by such means as adding gas or creating a vacuum, along with other suitable means for adjusting the atmosphere in the load lock chamber 13. When the correct atmosphere has been reached, the transfer mechanism 18 removes the carrier 30 from the load lock chamber 13. As a result, the carrier 30, along with the reticle 40, is moved from an ambient environment (i.e., space in the outer pod 20 and the housing 121) to a vacuum environment (i.e. space in the vacuum vessel 14).

Figure 12:
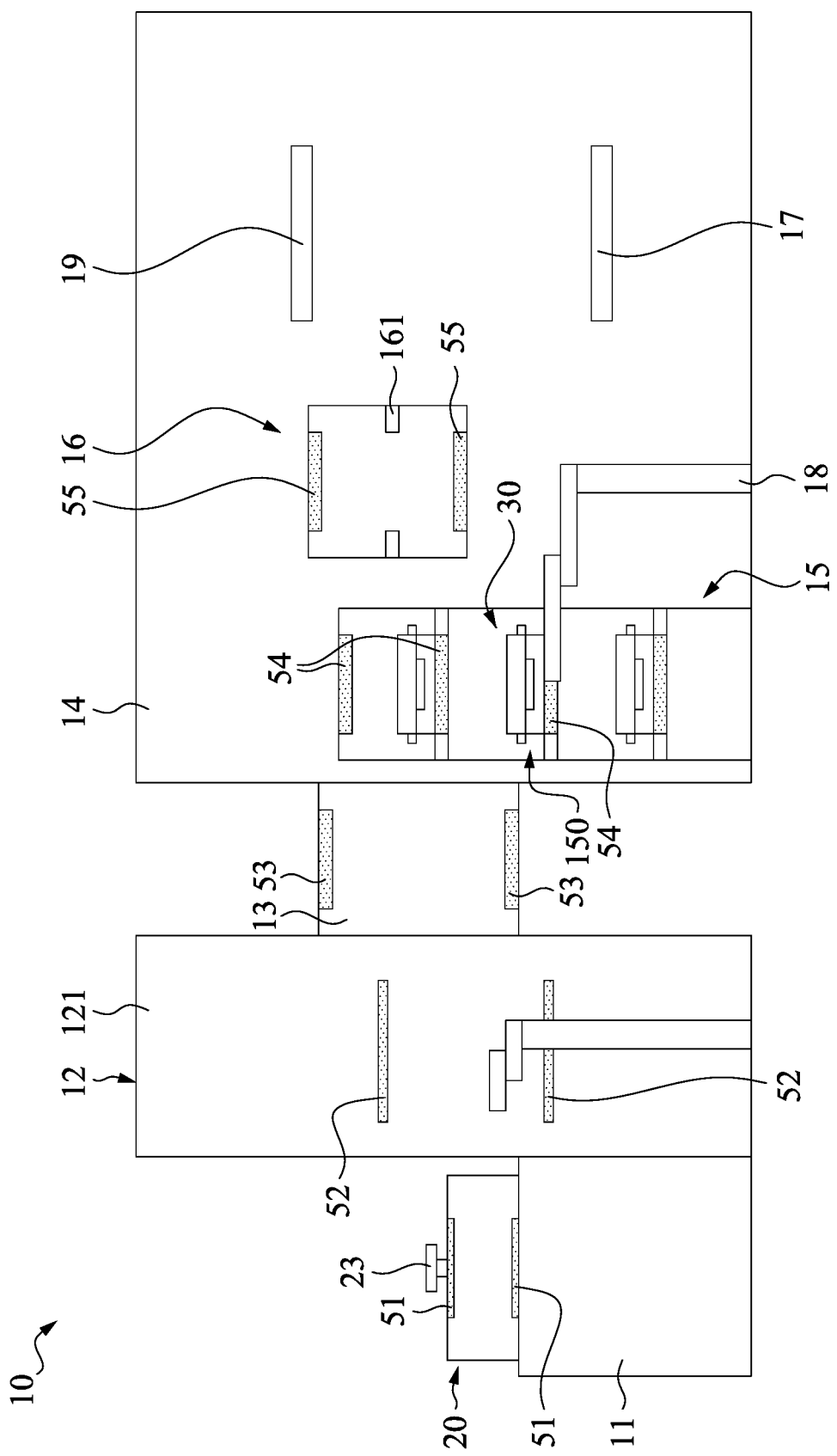
FIG. 12 shows a schematic view of a stage of a method for transporting a reticle for semiconductor fabrication in which a carrier along with a reticle is located in a reticle library, in accordance with some embodiments.

In some embodiments, after the carrier 30 is moved into the vacuum environment, the carrier 30 is transferred to the reticle library 15 by the transfer mechanism 18, as shown in FIG. 12. In some embodiments, the reticle library 15 stores more than one carriers 30, and reticles 40 with the same or different patterns are deposited in the carriers 30. With the arrangement of the reticle library 15, the time for exchanging reticles 40 in the lithography exposure apparatus 10 is reduced.

Figure 13:
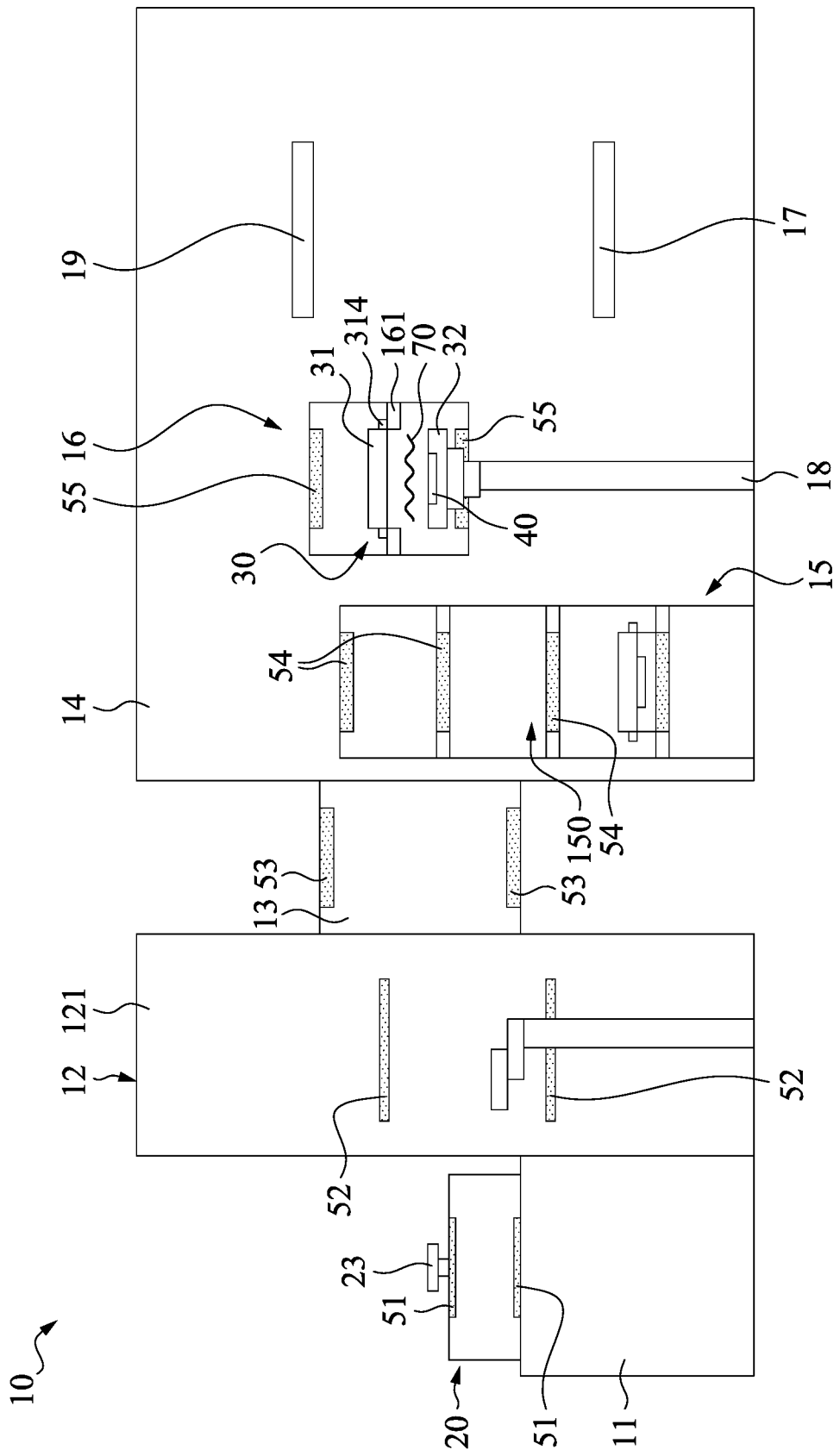
FIG. 13 shows a schematic view of a stage of a method for transporting a reticle for semiconductor fabrication in which a carrier is open in an upper lid handling chamber, in accordance with some embodiments.

In some embodiments, the carrier 30 is stayed in the reticle library 15 until the reticle 40 deposited in the carrier 30 is going to be used for a lithography exposure process. To mount the reticle 40 to the reticle chuck 19, the transfer mechanism 18 pulls the carrier 30 from the reticle library 15 and brings it to the upper lid handling chamber 16, as shown in FIG. 13. In the upper lid handling chamber 16, the flanges 314 of the upper lid 31 are supported by the holding members 161, and the upper lid 31 is left on the holding members 161 by moving the baseplate 32 downwardly. As a result, the upper lid 31 is removed from the baseplate 32. At this time, the reticle 40 is placed on the baseplate 32, and the magnetic element 62 on the baseplate 32 is exposed to the vacuum environment.

Figure 14:
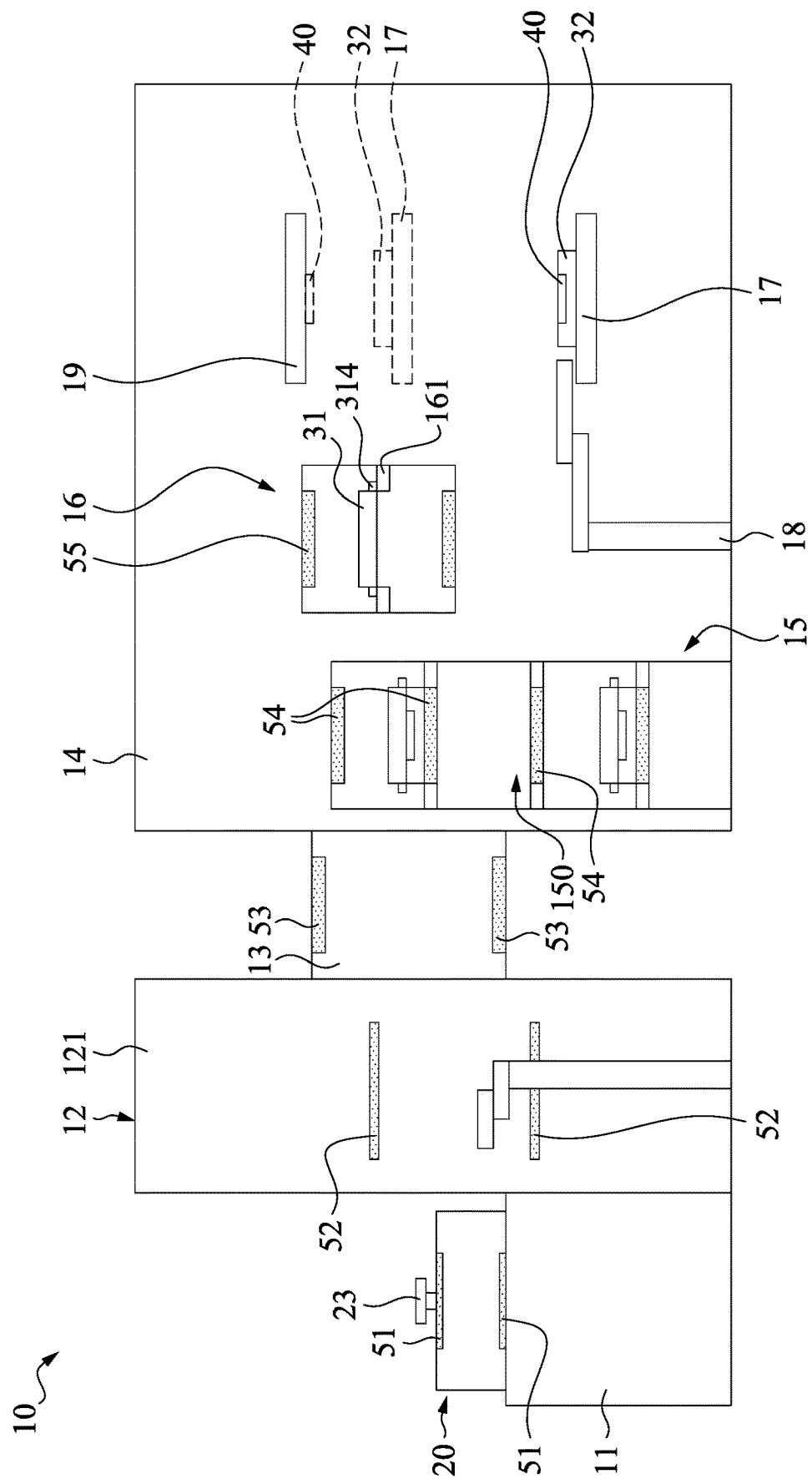
FIG. 14 shows a schematic view of a stage of a method for transporting a reticle for semiconductor fabrication in which a reticle is supported by a baseplate and moved to a reticle chuck, in accordance with some embodiments.

In some embodiments, after the upper lid 31 is removed from the baseplate 32, the baseplate 32 and reticle 40 are placed on the reticle exchanging station 17 by the transfer mechanism 18, as shown in FIG. 14. Afterwards, the reticle exchanging station 17 is elevated to a loading position as indicated by the dotted lines in FIG. 14 to create a direct contact between the bottom surface of the reticle 40 and the reticle chuck 19. Thus, operation S110 is completed.

The method S100 continues with operation S120, in which particles in the carrier 30 is regulated through a magnetic field. In some embodiments, the particles in the carrier 30 or around the carrier 30 are collected by the magnetic elements 61 and 62 positioned in the carrier 30.

In some embodiments, operation S120 is performed no matter the reticle 40 is positioned in the carrier 30 or removed from the carrier 30. In cases where the reticle 40 is supported by the carrier 30, particles accumulated on the reticle 40 may be removed from the reticle 40 so as to prevent de-focus issue in lithography exposure process. In cases where the reticle 40 is not received in the carrier 30, particles suspending around the carrier 30 can be attracted by the magnetic elements 61 and 62 to maintain cleanliness around the carrier 30. For example, the magnetic elements 61 may be used to collect particles around the reticle 40 when the upper lid 31 is left in the upper lid handling chamber 16. In addition, the magnetic element 62 may be used to collect particles around the reticle exchanging station 17 during the movement of the baseplate 32 on the reticle exchanging station 17.

In some embodiments, the magnetic elements 61 and 62 are designed to have sufficient intensity to attract particles around the carrier 30 even though the carrier 30 is closed. For example, the magnetic elements 61 and 62 may be used to attract particles in the transport pod 20, the interface module 12, the load lock chamber 13 and/or the reticle library 15 when the carrier 30 is located therein or passes therethrough.

In some embodiments, the magnetic elements 61 and 62 are electromagnets and the magnetic elements 61 and 62 are magnetized at particular time points. In one exemplary embodiment, the magnetic element 62 is magnetized when the reticle 40 is returned to the baseplate 32 from the reticle chuck 19 after the use in the lithography exposure process, and the magnetic element 61 is magnetized when the baseplate 32 with the used reticle 40 is returned to the upper lid handling chamber 16. Since small particles or debris, such as Sn particles, may be accumulated on the reticle 40 during the lithography exposure process, the magnetic elements 61 and 62 can be used to remove particles from the reticle 40. As a result, the life span of the reticle 40 is prolonged.

In some embodiments, at least one of the magnetic elements 61 and 62 is magnetized periodically. For example, the magnetic element 61 and the magnetic element 62 may be magnetized according to a predetermined time frequency when the reticle 40 is stored in the reticle 40. In some embodiments, at least one of the magnetic elements 61 and 62 is magnetized to have different intensities according to a function (e.g., sine function) for multiple times, so as to create different attraction force over the particles. As a result, stubborn particles may be removed and collected by the magnetic elements 61 and 62.

In another exemplary embodiment, the magnetic elements 61 and 62 are magnetized during the performance of operation S130 as described below. In another alternative exemplary embodiment, the magnetic elements 61 and 62 are magnetized for a predetermined time period (e.g., 5 seconds, 10 seconds, or 15 seconds) before the removal of reticle 40 from the carrier 30 in operation S140 as describe below.

In some embodiments, the particles in the carrier 30 or around the carrier 30 are regulated by the magnetic elements 51-55 positioned in the lithography exposure apparatus 10. Specifically, the particles in the carrier 30 or around the carrier 30 may be regulated by the magnetic element 51, when the carrier 30 is stored in the transport pod 20. The particles in the carrier 30 or around the carrier 30 may be regulated by the magnetic element 52, when the carrier 30 is moved in the interface module 12. The articles in the carrier 30 or around the carrier 30 may be regulated by the magnetic element 53, when the carrier 30 is stayed in the load lock chamber 13. The articles in the carrier 30 or around the carrier 30 may be regulated by the magnetic element 54, when the carrier 30 is stayed in the reticle library 15. The articles in the carrier 30 or around the carrier 30 may be regulated by the magnetic element 55, when the carrier 30 is placed in the upper lid handling chamber 16.

In cases where the magnetic elements 51-55 are electromagnets, the magnetic elements 51-55 may be magnetized when the carrier 30 is located nearby. For example, the magnetic elements 52 may be magnetized when the carrier 30 is moved through a channel between the two magnetic elements 52. Thus, a high magnet flux shower is produced around the carrier 30 to as to regulate particles in the carrier 30 or around the carrier 30. In another example, the magnetic elements 53 may be magnetized when the pressure in the load lock chamber is changed. In yet another example, the magnetic elements 55 may be magnetized when the baseplate 32 is moved relative to the upper lid 31.

In some embodiments, at least one of the magnetic elements 51-55 is magnetized periodically. For example, the magnetic element 51 and the magnetic element 54 may be magnetized according to a predetermined time frequency when the carrier 30 is stored in the transport pod 20 or in the reticle library 15. In some embodiments, at least one of the magnetic elements 51-55 is magnetized to have different intensities according to a function (e.g., sine function) for multiple times, so as to create different attraction force over the particles. As a result, stubborn particles may be removed and collected by the magnetic elements 51-55.

Figure 10:
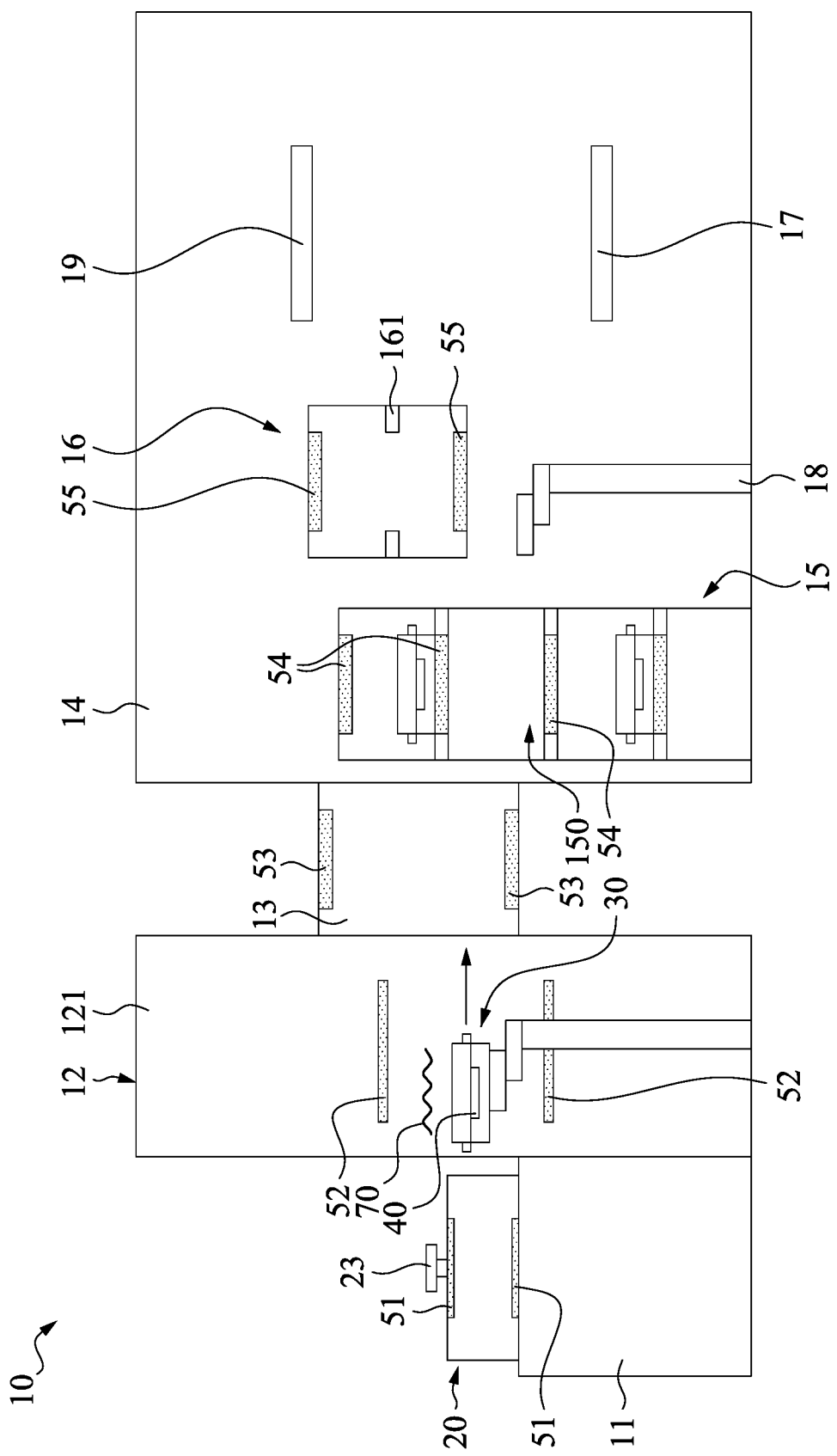
FIG. 10 shows a schematic view of a stage of a method for transporting a reticle for semiconductor fabrication in which a carrier along with a reticle is transported from a transport pod to an interface module, in accordance with some embodiments.

In operation S130, an air flow is produced around the reticle 40. In some embodiments, the air flow is produced around the reticle 40 due to a movement of the air relative to the carrier 30, and the air flow enters the carrier 30 through gas holes 315 formed on the upper lid 31. The air flow created resulting from a movement of the air relative to the carrier 30 may be occurred during the movement of the carrier 30 in an ambient environment, such as interface module 12, as shown in FIG. 10. The air flow created resulting from a movement of the air relative to the carrier 30 may also be occurred during the movement of the carrier 30 in a vacuum environment, such as vacuum vessel 14.

In some embodiments, the air flow is produced around the reticle 40 by actively creating an air pressure difference in the lithography exposure apparatus 10. For example, the air flow 70 is produced when the load lock chamber 13 is actuated to remove gas from the load lock chamber 13 or add gas into the load lock chamber 13, as shown in FIG. 11. In another example, the air flow is produced when the interface module 12 is actuated (e.g., by a fan) to generate a steady flow from a top roof to a bottom base.

In some embodiments, the air flow is produced around the reticle 40 by driving a relative movement between the upper lid 31 and the baseplate 32. For example, the air flow 70 is produced when the upper lid 31 is removed from the baseplate 32 to open the carrier 30 in the upper lid handling chamber 16, as shown in FIG. 13. Alternatively, the air flow is produced when the upper lid 31 is connected to the baseplate 32 to close the carrier 30 in the upper lid handling chamber 16.

Figure 15:
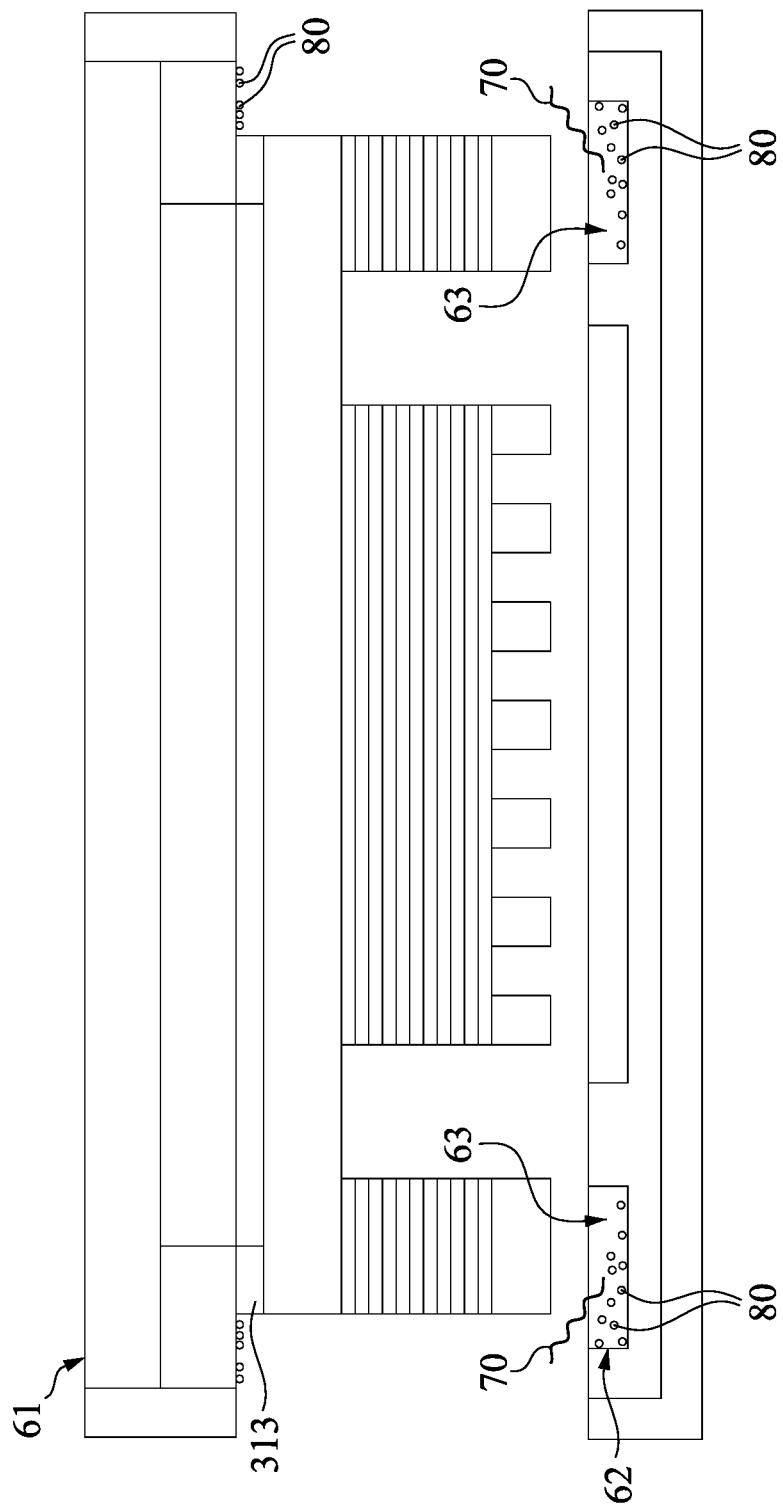
FIG. 15 shows a schematic view of a stage of a method for transporting a reticle for semiconductor fabrication in which particles are trapped on magnetic elements while an air flow is produced, in accordance with some embodiments.

In some embodiments, as shown in FIG. 15, when the air flow 70 is created, a portion of the air flow 70 may enter a gap formed between the reticle 40 and the baseplate 32 and contaminate the pattern region of the reticle 40. However, due to the formation of the groove 63 in the magnetic element 62, a turbulent flow may be created when the air flow 70 passes through the groove 63, which causes an increasing in a path of the particles 80 entering the gap between the reticle 40 and the baseplate 32. As a result, ferromagnetic particles can be more easily attracted to the magnetic element 62 by magnetic force, and non-magnetic particles can be trapped in the groove 63 by Van Der Waals force as well. In cases where air flow 70 around the reticle 40 sequentially passes through multiple grooves before its reaching the center 400 of the reticle 40, as shown in FIGS. 6-8, turbulent flow may occur in each of the grooves in the flowing path of the air flow 70, and particles 80 may be trapped by these grooves.

In operation S140, the reticle 40 is removed from the carrier 30. In some embodiments, as shown in FIG. 14, when the reticle exchanging station 17 is elevated to the loading position as indicated by the dotted lines in FIG. 14, the reticle 40 is secured by the reticle chuck 316 with the clamping force generated by the reticle chuck 19. After the reticle 40 is secured by the reticle chuck 19, the vacant baseplate 32 is lowered down to its original position as indicated by solid lines in FIG. 14.

The method S100 continues with operation S150, in which a semiconductor process is performed with the use of the reticle 40. In some embodiments, the reticle 40 is used for a lithography exposure process, such as being subjected to an extreme ultraviolet (EUV) light. Elements of the lithography exposure apparatus 10 for performing the lithography exposure process are described hereinafter.

Figure 16:
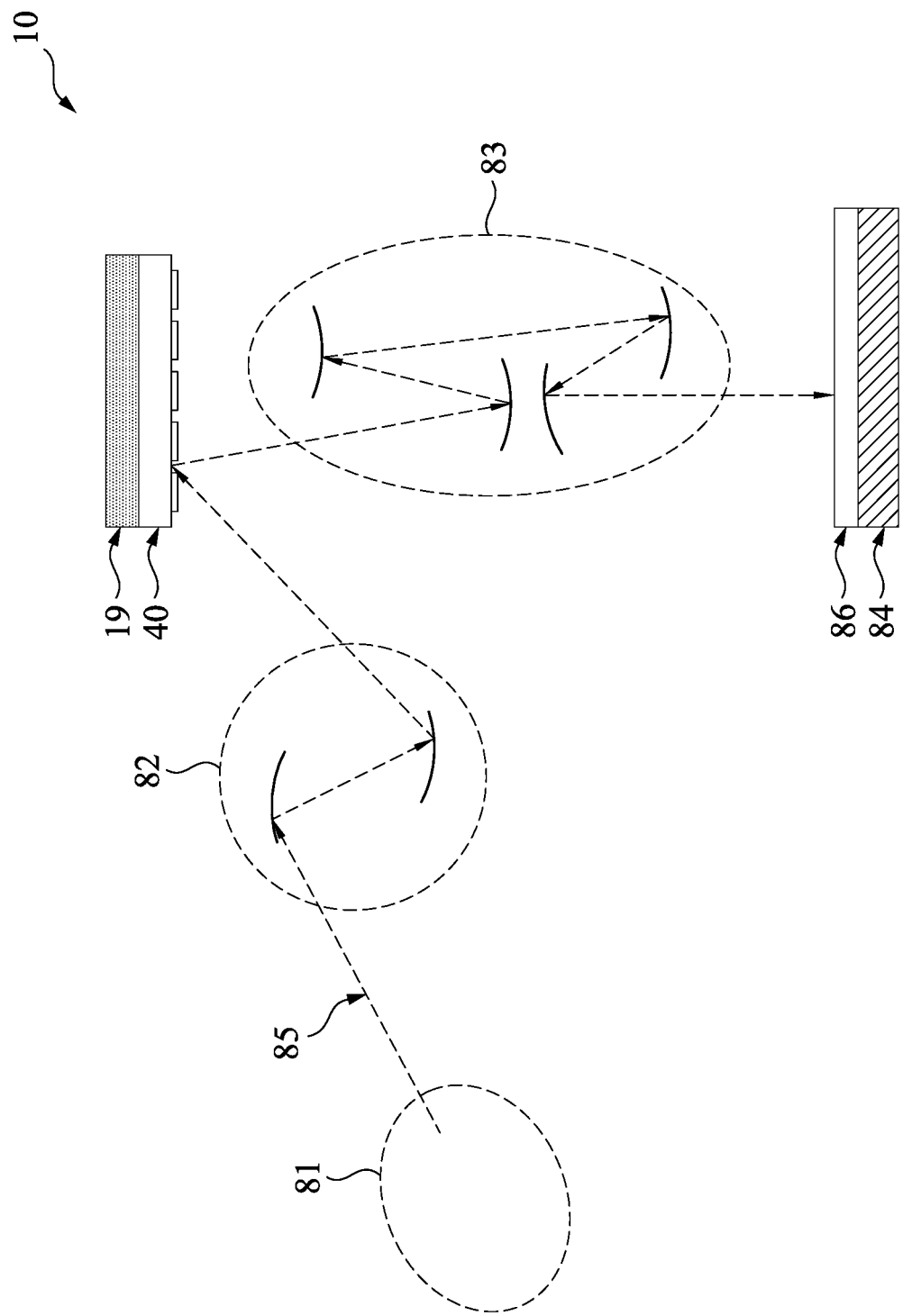
FIG. 16 is a schematic and diagrammatic view of a lithography exposure apparatus, in accordance with some embodiments.

FIG. 16 is a schematic and diagrammatic view of the lithography exposure apparatus 10, in accordance with some embodiments. The lithography exposure apparatus 10 further includes a light source 81, an illuminator 82, a projection optics module (or projection optics box (POB)) 83 and a substrate stage 84, in accordance with some embodiments. The light source 81 is configured to generate radians having a wavelength ranging between about 1 nm and about 100 nm. In one particular example, the light source 81 generates an EUV light with a wavelength centered at about 13.5 nm. Accordingly, the light source 81 is also referred to as EUV light source. However, it should be appreciated that the light source 81 should not be limited to emitting EUV light. The light source 81 can be utilized to perform any high-intensity photon emission from excited target material.

In various embodiments, the illuminator 82 includes various refractive optic components, such as a single lens or a lens system having multiple lenses (zone plates) or alternatively reflective optics (for EUV lithography exposure apparatus), such as a single mirror or a mirror system having multiple mirrors in order to direct light from the light source 81 onto the reticle 40, particularly to the reticle 40 secured on the reticle chuck 19. In the present embodiment where the light source 81 generates light in the EUV wavelength range, reflective optics is employed.

The projection optics module (or projection optics box (POB)) 83 is configured for imaging the pattern of the reticle 40 on to a semiconductor wafer 86 secured on a substrate stage 84 of the lithography exposure apparatus 10 for a lithography exposure process. In some embodiments, the POB 83 has refractive optics (such as for a UV lithography exposure apparatus) or alternatively reflective optics (such as for an EUV lithography exposure apparatus) in various embodiments. The light directed from the reticle 40, carrying the image of the pattern defined on the mask, is collected by the POB 83. The illuminator 82 and the POB 83 are collectively referred to as an optical module of the lithography exposure apparatus 10.

In the present embodiment, the semiconductor wafer 86 may be made of silicon or other semiconductor materials. Alternatively or additionally, the semiconductor wafer 86 may include other elementary semiconductor materials such as germanium (Ge). In some embodiments, the semiconductor wafer 86 is made of a compound semiconductor such as silicon carbide (SiC), gallium arsenic (GaAs), indium arsenide (InAs), or indium phosphide (InP). In some embodiments, the semiconductor wafer 86 is made of an alloy semiconductor such as silicon germanium (SiGe), silicon germanium carbide (SiGeC), gallium arsenic phosphide (GaAsP), or gallium indium phosphide (GaInP). In some other embodiments, the semiconductor wafer 86 may be a silicon-on-insulator (SOI) or a germanium-on-insulator (GOI) substrate.

In addition, the semiconductor wafer 86 may have various device elements. Examples of device elements that are formed in the semiconductor wafer 86 include transistors (e.g., metal oxide semiconductor field effect transistors (MOSFET), complementary metal oxide semiconductor (CMOS) transistors, bipolar junction transistors (BJT), high voltage transistors, high-frequency transistors, p-channel and/or n-channel field-effect transistors (PFETs/NFETs), etc.), diodes, and/or other applicable elements. Various processes are performed to form the device elements, such as deposition, etching, implantation, photolithography, annealing, and/or other suitable processes. In some embodiments, the semiconductor wafer 86 is coated with a resist layer sensitive to the EUV light in the present embodiment. Various components including those described above are integrated together and are operable to perform lithography exposing processes.

In some embodiments, particles may be accumulated on a bottom surface 402 or a front-side surface 403 of the reticle 40 which may result in degradation of the quality of the projected pattern on the semiconductor wafer 86 in lithography exposure process. However, since particles are sufficiently removed from the reticle 40 before its loading on the reticle chuck 19, the concern of the particulate contamination (such as particles, powders, and organic matters) on the reticle 40 is released or mitigated.

In some embodiments, after the lithography exposure process is finished, the reticle 40 is unloaded from the reticle chuck 19 and sent back to the baseplate 32. The baseplate 32 is then sent to the upper lid handling chamber 16 for the engagement with the upper lid 31, and the closed carrier 30 is delivered to the reticle library 15. Because the magnetic elements 61 covers the entire area of the front-side surface of reticle 40, particles accumulated on the reticle 40 during the lithography exposure process can be removed sufficiently when the reticle 40 is placed on the baseplate 32. In addition, after the upper lid 31 is connected to the baseplate 32, because the magnetic elements 62 covers the entire area of the bottom surface of reticle 40, particles accumulated on the reticle 40 during the lithography exposure process can be removed sufficiently when the carrier 30 is closed.

Embodiments of a method for transporting reticle in lithography system use one or more magnetic elements to regulate particle. The magnetic elements prevent the reticle from being contaminated. As a result, the processing quality and the production yield are improved. In addition, since the life span of the reticle is prolonged, the manufacturing cost is reduced because the reticle does not move to maintenance or repair frequently.

In accordance with some embodiments, a method for processing a semiconductor wafer is provided. The method includes transporting a carrier along with a reticle supported by the carrier in a lithography exposure apparatus. The method also includes regulating particles in the carrier through a magnetic field. In addition, the method includes removing the reticle from the carrier. The method further includes performing, using the reticle, a lithography exposure process to the semiconductor wafer in the lithography exposure apparatus.

In accordance with some embodiments, a method for transporting a reticle for semiconductor fabrication is provided. The method includes transporting a carrier along with a reticle supported by the carrier. The method also includes creating an air flow around the reticle. In addition, the method includes regulating particles in the carrier through a magnetic field during the creation of the air flow.

In accordance with some embodiments, a carrier for storing a reticle is provided. The carrier includes a baseplate having an inner region and an outer region surrounding the inner region, wherein the baseplate comprises a plurality of stubs arranged on a boundary of the inner region and the outer region. The carrier also includes an upper lid connected to the baseplate to form a space for receiving the reticle. The carrier further includes a first magnetic element positioned on one of the baseplate and the upper lid, wherein a projection of the first magnetic element overlaps the inner region of the baseplate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of processing a semiconductor wafer, comprising:
   transporting a carrier along with a reticle supported by the carrier in a lithography exposure apparatus;
   regulating particles in the carrier through a magnetic field generated by a magnetic element positioned in the carrier, wherein regulating particles in the carrier comprises collecting the particles in a groove that is formed in the magnetic element;
   removing the reticle from the carrier; and performing, using the reticle, a lithography exposure process to the semiconductor wafer in the lithography exposure apparatus.

2. The method as claimed in claim 1, wherein the magnetic element faces the reticle.

3. The method as claimed in claim 1, wherein the groove is located relative to an edge of the reticle.

4. The method as claimed in claim 1, wherein the magnetic element comprises a first magnetic element and a second magnetic element, and regulating the particles in the carrier through the magnetic field further comprises:
attracting the particles by the first magnetic element and the second magnetic element surrounded by the first magnetic element, wherein an intensity of the magnetic field of the first magnetic element is greater than an intensity of the magnetic field of the second magnetic element.

5. The method as claimed in claim 1, further comprising creating an air flow around the reticle.

6. The method as claimed in claim 5, wherein regulating the particles in the carrier through the magnetic field comprises:
generating the magnetic field through the magnetic element comprising at least one electromagnet;
wherein the magnetic field is generated during the creation of the air flow around the reticle.

7. The method as claimed in claim 5, wherein transporting the carrier along with the reticle supported by the carrier in the lithography exposure apparatus comprises:
placing the reticle in a load lock chamber of the lithography exposure apparatus; and
creating an atmosphere in the load lock chamber compatible with a position where the carrier is scheduled to be next;
wherein the air flow is produced when the carrier is positioned in the load lock chamber.

8. The method as claimed in claim 5, wherein the air flow is produced when an upper lid and a baseplate of the carrier is separated.

9. The carrier as claimed in claim 1, wherein an inner sidewall of the groove is located directly below a border region of the reticle.

10. The carrier as claimed in claim 1, wherein the reticle comprises a pattern region, a border region, and a trench between the pattern region and the border region, wherein the groove is distant from the trench of the reticle.

11. A method of transporting a reticle for semiconductor fabrication, comprising:
transporting a carrier along with a reticle supported by the carrier;
creating an air flow around the reticle;
generating a magnetic field through at least one electromagnet located adjacent to a position at which the reticle is placed in a lithography exposure apparatus, wherein the magnetic field is generated during the creation of the air flow around the reticle; and
regulating particles in the carrier through the magnetic field during the creation of the air flow.

12. The method as claimed in claim 11, wherein regulating the particles in the carrier through the magnetic field comprises:
attracting the particles by a magnetic element comprising the at least one electromagnet positioned in the carrier and facing the reticle.

13. The method as claimed in claim 12, wherein regulating the particles in the carrier through the magnetic field further comprises:
collecting the particles in a groove that is formed on the magnetic element and located relative to an edge of the reticle.

14. The method as claimed in claim 11, wherein regulating the particles in the carrier through the magnetic field comprises:
attracting the particles by a first magnetic element positioned in the carrier and a second magnetic element surrounded by the first magnetic element, wherein at least one of the first magnetic element and the second magnetic element comprise the electromagnet, and an intensity of the magnetic field of the first magnetic element is greater than an intensity of the magnetic field of the second magnetic element.

15. The method as claimed in claim 11, wherein the reticle comprises a reticle used in a lithography exposure process.

16. The method as claimed in claim 11, wherein transporting the carrier along with the reticle supported by the carrier in the lithography exposure apparatus comprises:
placing the reticle in a load lock chamber of the lithography exposure apparatus; and
creating an atmosphere in the load lock chamber compatible with a position where the carrier is scheduled to be next;
wherein the air flow is produced when the carrier is positioned in the load lock chamber.

17. The method as claimed in claim 11, wherein the air flow is produced when an upper lid and a baseplate of the carrier is separated.

18. A carrier for storing a reticle, comprising:
a baseplate having an inner region and an outer region surrounding the inner region, wherein the baseplate comprises a plurality of stubs arranged on a boundary of the inner region and the outer region;
an upper lid connected to the baseplate to form a space for receiving the reticle; and
a first magnetic element positioned on one of the baseplate and the upper lid, wherein a projection of the first magnetic element overlaps the inner region of the baseplate, and the first magnetic element has a groove formed with a ring shape, and an outer wall of the groove is located in the outer region and an inner wall of the groove is located in the inner region.

19. The carrier as claimed in claim 18, further comprising a second magnetic element, wherein the first magnetic element and the second magnetic element are respectively positioned on the baseplate and the upper lid.

20. The carrier as claimed in claim 18, further comprising a second magnetic element, wherein the first magnetic element and the second magnetic element are both positioned on one of the baseplate and the upper lid, and the second magnetic element is surrounded by the first magnetic element;
wherein an intensity of a magnetic field of the first magnetic element is greater than an intensity of a magnetic field of the second magnetic element.

* * * * *